United States Patent
Hala et al.

(10) Patent No.: US 6,826,490 B2
(45) Date of Patent: Nov. 30, 2004

(54) TRANSDUCER CALIBRATION SYSTEM: APPARATUS AND METHOD

(75) Inventors: Roger A. Hala, Gardnerville, NV (US); Ingrid M. Foster, Carson City, NV (US)

(73) Assignee: Bentley Nevada, LLC, Minden, NV (US)

( * ) Notice: Subject to any disclaimer, the term of this patent is extended or adjusted under 35 U.S.C. 154(b) by 132 days.

(21) Appl. No.: 10/243,542

(22) Filed: Sep. 12, 2002

(65) Prior Publication Data

US 2004/0054487 A1 Mar. 18, 2004

(51) Int. Cl.⁷ .............................. G01L 1/00; G01L 3/00; G01L 5/00; G06F 19/00
(52) U.S. Cl. ............................ 702/41; 702/39; 702/64; 702/83; 702/94; 702/104; 73/1.82; 73/602; 73/624; 73/627; 73/862.63; 73/1.88; 73/129; 324/207.1; 324/613; 324/608; 417/12; 417/18; 417/53; 340/650
(58) Field of Search .............................. 702/39, 41, 64, 702/83, 94; 73/1.82, 77; 324/207.1, 613; 340/650; 417/12, 18, 53

(56) References Cited

U.S. PATENT DOCUMENTS

| | | | |
|---|---|---|---|
| 3,744,294 A | * 7/1973 | Lewis et al. | 73/1.82 |
| 4,391,124 A | * 7/1983 | Drost et al. | 73/1.82 |
| 4,446,715 A | * 5/1984 | Bailey | 73/1.88 |
| 5,280,718 A | * 1/1994 | Drake et al. | 73/129 |
| 5,854,553 A | 12/1998 | Barclay et al. | |
| 6,438,288 B1 | * 8/2002 | Tehrani | 385/27 |
| 6,703,843 B2 | * 3/2004 | Slates | 324/608 |

OTHER PUBLICATIONS

Bently Nevada Corporation, Monitor and Transducer Verification Kits, Specifications and Ordering Information, Aug. 2001, pp. 1 through 5, Bently Nevada Corporation, Minden, Nevada USA, Internet: www.bently.com.

* cited by examiner

*Primary Examiner*—John Barlow
*Assistant Examiner*—Aditya Bhat
(74) *Attorney, Agent, or Firm*—Dennis A. DeBoo

(57) ABSTRACT

A transducer calibration apparatus and method for transforming both previously established transducer parameters for a transducer calibrated to a first target object material and measured transducer parameters for the transducer monitoring a second different target object material into a calibration parameter and transforming the output of the transducer and thus, the use of the transducer, from the first target object material used to calibrate the transducer to the second different target object material being subsequently monitored by the transducer by linearizing the output of the transducer into gap values as a function of the calculated calibration parameter and then, generating alarms based on the linearized output of the transducer exceeding established limits and using the alarms to automatically shut down a machine being monitored by the transducer and/or automatically annunciate machine problems to personnel.

14 Claims, 7 Drawing Sheets

Figure 7

TRANSDUCER CALIBRATION SYSTEM: APPARATUS AND METHOD

FIELD OF THE INVENTION

The present invention relates generally to a transducer calibration system and, in particular, to a transducer calibration apparatus and method for automating transducer calibration or configuration including transforming an output of a transducer and thus, the use of the transducer, from a first target object material used to calibrate the transducer to a second different target object material being subsequently monitored by the transducer.

BACKGROUND OF THE INVENTION

As is well known in the art, machinery protection systems are designed to employ a variety of transducers and display appropriate machinery parameters. Alarms are generated based on the measurements made by the employed transducers and when conditions exceed user-established limits the alarms can be used to automatically shut down the machine and/or to annunciate machinery problems to operators and other plant personnel.

Proximity probe protection systems which analyze and monitor, for example, rotating and reciprocating machinery are well known in the art. These systems typically include one or more proximity probes which can be defined as noncontacting eddy current displacement devices operating on the eddy current principle for measuring displacement motion and position of an observed conductive target object relative to one or more of the displacement devices. Typically, each proximity probe is located proximate a target object being monitored such as a rotating shaft of a machine, an outer race of a rolling element bearing, or a piston rod of a machine and is operatively coupled to signal conditioning circuitry which in turn is coupled to a monitor or analyzing apparatus for data reduction and display. By known techniques, these systems analyze and monitor rotating and reciprocating machinery for providing, inter alia, indications of incipient problems. A variety of proximity probes, signal conditioning circuitry and monitors are at the present time being sold by the assignee of this application, Bently Nevada, LLC of Minden, Nev.

Ideally, proximity probe systems are manufactured to meet published performance specifications. They have a specified linear range and an average scale factor over that linear range. Typically, transducers are calibrated or measured against a particular material and one common standard is for a transducer to be calibrated or measured against 4140 steel of which many rotating shafts are made.

However, there are cases where the material of a target object to be monitored by a transducer is not the same as was used to calibrate that transducer. For example, in reciprocating compressors piston rods are generally not 4140 steel. Notwithstanding the above, cost reduction, ease of stocking spare parts and logistics often dictate that a standard transducer (e.g., calibrated or measured against 4140 steel) be used. Hence, in order to use a standard transducer to monitor the movement of a piston rod, the linear range and average scale factor of the standard transducer when it is viewing the piston rod material must be identified and only then can the average scale factor and linear range be used by the monitor to accurately calculate piston rod movement.

The following discussion describes a current method of determining the transducer performance when different materials are used for the measurement target. A specific example of setting up a piston rod monitoring system will be employed in delineating the current method. When setting up a piston rod monitoring system the user must generate a transducer curve for the compressor piston rod. A precision micrometer can be used to run or generate a transducer curve and one such precision micrometer for generating a transducer curve for, inter alia, setting up a rotating shaft or a piston rod monitoring system is sold at the present time by the assignee of this application, Bently Nevada, LLC of Minden, Nev. under the name 3300 XL Precision Micrometer. This particular precision micrometer has collets to fit both metric and English 5 mm, 8 mm, 11 mm, and 14 mm probes and includes means for a removable target button.

When employing the 3300 XL Precision Micrometer the probe fits into a probe-mounting collet that holds the probe stationary. A specially made target button can be constructed of the shaft or rod material and can be attached to the micrometer shaft. As the user moves the micrometer, the target button is moved toward or away from the probe tip. The target button simulates the rod or shaft and it's proximity to the probe tip. The target button must be made of the same material as the piston rod or shaft that is to be monitored.

However, this method is problematic because in many cases the customer does not have a target button made of the same material as the piston rod or even the shaft. In that case, a shaft micrometer apparatus such as the one sold at the present time by the assignee of this application, Bently Nevada, LLC of Minden, Nev. under the name 3300 XL Shaft Micrometer can be used to run a transducer curve.

This particular precision shaft micrometer apparatus includes a strap which is attached to a mounting base through eyelets, is wrapped around the target (piston rod), and is tightened to hold the mounting base firmly in position. A probe-mounting collet holds the probe in the mounting base parallel to the micrometer. As the user moves the micrometer the probe moves toward or away from the target (piston rod). Thus, a proximity probe/transducer, signal conditioning circuitry, a shaft micrometer including mounting means, a monitor, and a multimeter can be employed as is known in the art and in accordance with the following procedure for generating the transducer system curve when viewing a piston rod.

First, the probe is mounted adjacent the target and the transducer system is zeroed by adjusting the probe in a probe adapter until its tip is flush with the target while the micrometer is at zero. A set screw in the adapter is tightened to hold the relative locations of the probe with the micrometer. For the first gap reading the micrometer is, for example, backed off 10 mils (or 250 micrometers) if using an 11 or 14 mm probe or it is backed off 5 mils (or 125 micrometers) if using an 8 mm transducer. The gap voltage is read from the multimeter and is recorded by hand in a gap voltage row of a table. The process is repeated until a predetermined number of gap voltages are recorded. Next, incremental scale factor values (ISF values) are calculated by taking the difference between adjacent gap voltages and dividing by, for example, 10 mils (250 micrometers) for 11 mm or 14 mm probes or dividing by 5 mils (125 micrometers) for 8 mm probes. The incremental scale factors are recorded. Then a graph is plotted of voltage values versus probe gaps.

Next, the user determines the linear range of the transducer from the information gathered according to the following criteria:

1) By visual inspection the user determines the endpoints of the linear area of the curve;

2) From these endpoints, an Upper Gap Voltage and a Lower Gap Voltage are determined for defining the outer edges of the usable range of the transducer and are preferably chosen from the incremental voltages listed in the gap voltage row;

3) Additionally, the user is suppose to verify that for the range identified the incremental scale factors are within 10% of the average scale factor (ASF). The ASF is defined as: ASF=|(Upper Gap Voltage−Lower Gap Voltage)|/Total Range, where the Total Range=Upper Gap−Lower Gap (in mils or micrometers). For example, if the Upper Gap Voltage is a negative 18.3 volts, the Lower Gap Voltage is a negative 4.1 volts, the Upper Gap is equal to 90 mils and the lower gap is equal to 20 mils then the Total Range is 70 mils (Total Range=90 mils−20 mils=70 mils) and the Average Scale Factor is 203 mV/mil (ASF=|(−18.3−−4.1)|/70=203 mV/mil);

4). If the less than or equal to 10% deviation requirement isn't met the user should adjust the range chosen and repeat step 3 until the criteria is met.

As can be seen, the above method is laborious, time consuming, and prone to user mistakes as a result of the user being required to perform iterative entries and calculations by hand to determine the usable range of the transducer when viewing the piston rod material. Additionally, the user was suppose to perform the laborious, time consuming, and error prone task of calculating the ASF over the defined range and checking to see if each of the incremental scale factors were then within 10% of the ASF.

It has been recognized that the user does not always verify the linearity of the chosen range by looking at the incremental scale factors as directed. In many current monitoring systems, the user is only required to enter the endpoint voltages (Upper Gap Voltage and Lower Gap Voltage) and their associated gaps into monitors. The monitors then "assumed" linearity, using the endpoints to calculate the ASF as shown in the equation above and did nothing to verify the incremental scale factors versus the ASF less than 10% deviation requirement. The monitor then used the ASF in its calculations for monitoring rod drop.

Hence, users may have never even realized that they had a problem related to nonlinearity of their system because they weren't required to understand how to verify the linearity. Thus, the present invention recognizes the problem of and provides a unique solution to the nonlinearity problems and further provides, inter alia, a system for uniquely solving the problem of performing the above delineated laborious, time consuming, and error prone tasks associated with the present method of taking transducer readings, calculating incremental scale factors from the transducer readings, visually determining endpoints of a linear area of operation of the transducer, and then correctly verifying the linearity of the chosen range for determining a scale factor.

SUMMARY OF THE INVENTION

The present invention is distinguished over the known prior art in a multiplicity of ways. For one thing, the present invention provides a transducer calibration system that automates the calibration of a transducer for eliminating the laborious, time consuming, and error prone tasks associated with the prior art method of calibrating transducers. Additionally, the present invention provides a transducer calibration system that verifies linearity of a transducer and determines a maximum linear range of operation of the transducer and then determines a calibration or scaling factor as a function of the determined maximum linear operating range of the transducer for use in monitoring machinery. Furthermore, the present invention provides a transducer calibration system that automates transducer curve linearity determination by transforming both previously established transducer calibration parameters for the transducer monitoring a first target object and measured transducer calibration parameters for the transducer monitoring a second perhaps different target object material for linearizing the output of the transducer from the first target object material used to calibrate the transducer to the second perhaps different target object material being monitored by the transducer.

In one form, the present invention provides a transducer calibration system that calibrates a transducer by transforming a standard or default calibration curve for a first target material and a measured transducer calibration curve for a second different target material into a calibration parameter for transforming the output of the transducer and thus, the use of the transducer, from the first target object material used to calibrate the transducer to the second different target object material for accurately monitoring the second different target object material with the transducer.

In one particular form, the present invention provides a transducer calibration system which can be embodied in a machinery protection system monitoring rotating and/or reciprocating machines or mechanical systems and which is comprised of at least one transducer calibrated to a first target object material and monitoring a second different target object material for outputting an analog electrical signal correlative to distances between the transducer and the second different target object material being monitored by the transducer. The system further includes a conditioning device for conditioning the analog electrical signal output of the transducer and a sampling means such as an analog to digital converter coupled to the conditioning device for sampling and digitizing the conditioned analog electrical signal output for converting the analog electrical signal output to a digital signal output correlative to the distance between the second different target object material and the transducer.

Additionally, the system includes a processor and associated memory such as a computer for transforming previously established transducer parameters for the transducer monitoring the first target object material and the digital signal output taken at measured gap distances between the transducer and the second different target object material into a new calibration parameter for use with the transducer for transforming the output of the transducer and thus, the use of the transducer, from the first target object material used to previously calibrate the transducer to the second different target object material such that the transducer can accurately monitor a material (the second different target object material) that is different than that of the first target object to which the transducer was initially calibrated. In one form, this can be accomplished by the processor calculating and downloading the new calibration parameter to a monitor coupled to the transducer for subsequent monitoring of the second different target object material by the transducer as a function of the new calibration parameter linearizing the output of the transducer from the first to the second target object.

Additionally, and in one particular form, the present invention provides a transducer calibration system for calibrating a transducer to a different target object material than that which the transducer had been previously calibrated to in accordance with a method of the present invention, the steps of the method including: 1) loading a default configuration of a transducer into a memory of a computer, the default configuration comprised of N voltage values and N−1 incremental scale factor values correlative to the N voltage values starting with N equal to 2, where N is an integer; 2) iteratively replacing at least one of the N voltage values and recalculating the N−1 incremental scale factor values during each iteration wherein a final iteration defines N−1 final incremental scale factor values; 3) identifying a series of adjacent incremental scale factor values from the N−1 final ISF values that meet a predefined criteria; 4) calculating a transducer calibration parameter as a function of the identified series of adjacent incremental scale factor values; 5) transforming the output of the transducer and thus, the use of the transducer, from the first target object material to the second different target object material by linearizing the output of the transducer into gap values as a function of the calculated calibration parameter and correlative to a distance between the transducer and the second different target object material being monitored.

In accordance with the present invention, this method can further include the step of downloading the calibration parameter to a monitor operatively coupled to the transducer for transforming the output of the transducer and thus, the use of the transducer, from the first target object material to the second different target object material by linearizing the output of the transducer as a function of the calculated calibration parameter such that the output of the transducer monitoring the second different target object material is transformed into gap values correlative to a distance between the transducer and the second different target object material being monitored.

Moreover, having thus summarized the invention, it should be apparent that numerous modifications and adaptations may be resorted to without departing from the scope and fair meaning of the present invention as set forth as described hereinbelow by the claims.

OBJECTS OF THE INVENTION

Accordingly, a primary object of the present invention is to provide a new, novel and useful automated transducer calibration system: apparatus and method.

A further object of the present invention is to provide an automated transducer calibration system for use with an asset monitoring system employed in monitoring assets such as rotating and reciprocating machinery.

Another further object of the present invention is to provide an automated transducer calibration system for use with a rod drop monitoring system.

Another further object of the present invention is to provide a system as characterized above which uniquely automates incremental scale factor value (ISF), average scale factor value (ASF) and percent deviation calculations for the user.

Another further object of the present invention is to provide a system as characterized above which uniquely identifies the largest linear range available for the given transducer system which can be employed with the monitor for restricting the use of the transducer to the linear portion of the curve.

Another further object of the present invention is to provide a system as characterized above which uniquely determines a calibration factor from the uniquely identified largest linear range for defining a calculated calibration parameter.

Another further object of the present invention is to provide a system as characterized above which uniquely transforms the output of a transducer and thus, the use of the transducer, from a first target object material to a second different target object material by linearizing the output of the transducer into gap values as a function of the calculated calibration parameter such that the transducer can accurately monitor the second target object material formed from a material that is different than that of the first target object to which the transducer was initially calibrated.

Theses objects along with other objects and advantages will be made manifest when considering the following detailed specification when taken in conjunction with the appended drawing figures. Moreover, industrial applicability of this invention is demonstrated by these objects.

BRIEF DESCRIPTION OF THE DRAWINGS

FIG. 7 is a screenshot view of a third calibration view pursuant to the present invention showing the completion of voltage entries in the calibration form shown in FIG. 6.

DESCRIPTION OF PREFERRED EMBODIMENTS

Figure 1:
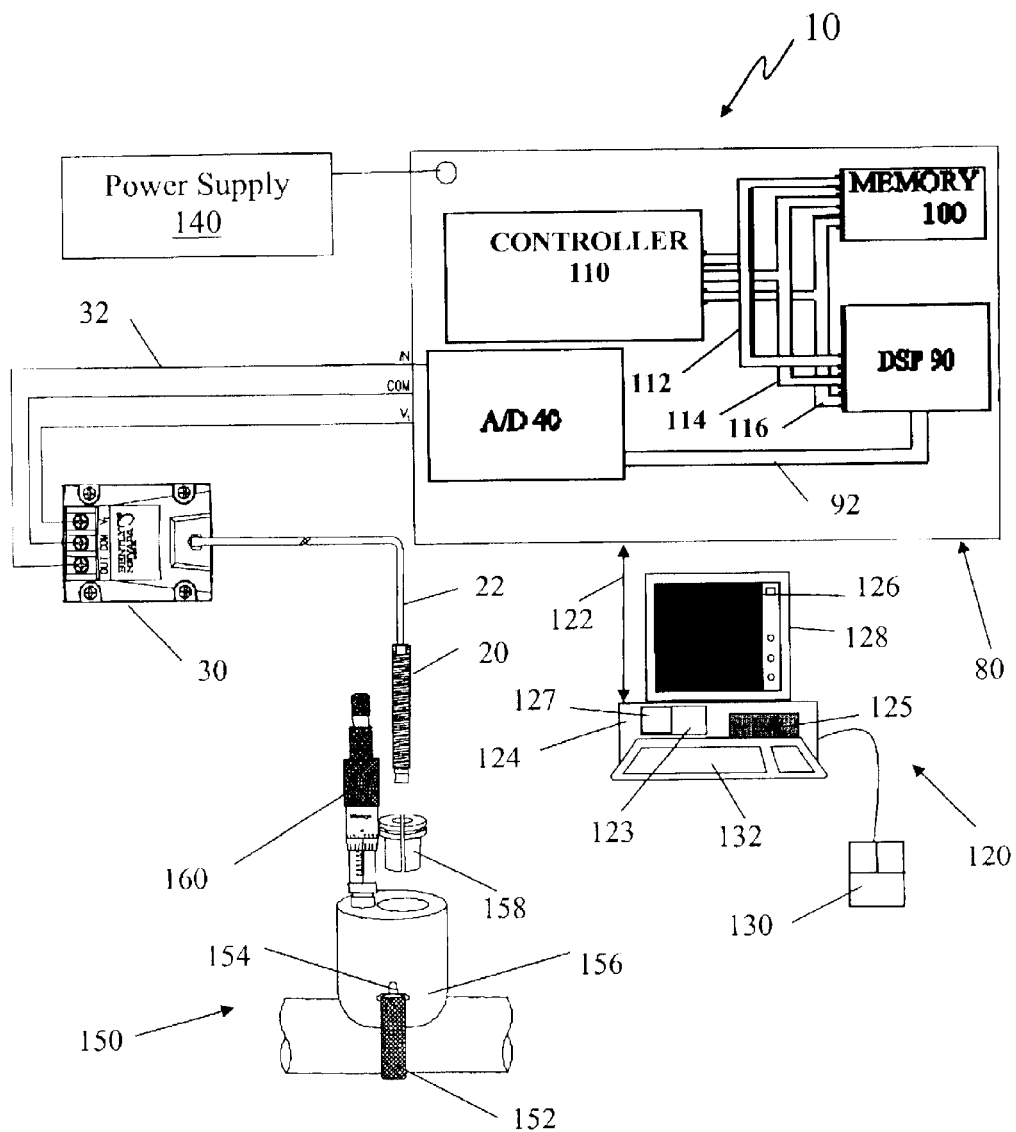
FIG. 1 is a functional schematic diagram of a transducer calibration system pursuant to the present invention.

Considering the drawings, wherein like reference numerals denote like parts throughout the various drawing figures, reference numeral 10 is directed to the transducer calibration system according to the present invention.

Figure 2:
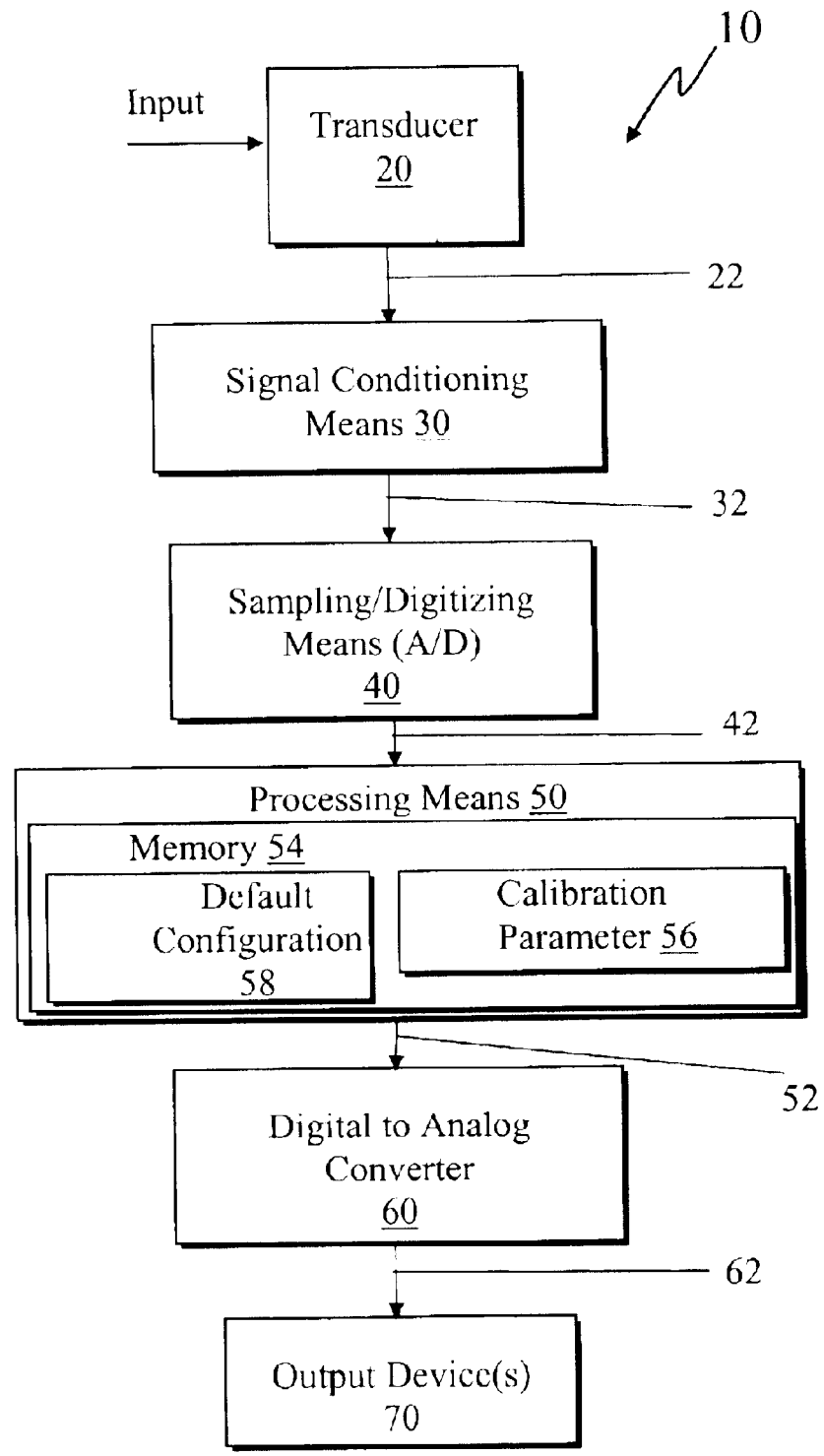
FIG. 2 is a block diagram of a transducer calibration system pursuant to the present invention.

In its essence, and referring to the drawings and particularly to FIG. 2, the present invention provides a transducer calibration system 10 comprised of at least one transducer 20, a conditioning means 30, a sampling and digitizing means 40, and a processing means 50 operatively coupled together via respective connections 22, 32, and 42 for, respectively, outputting an electrical signal correlative to a target object position or movement, conditioning the electrical signal, sampling and digitizing the conditioned electrical signal for defining measured transducer parameters and communicating the measured transducer parameters to processing means 50, transforming both previously established transducer parameters (e.g., a default configuration 58 stored in a memory 54 of the processing means 50) for the transducer monitoring a first target object material and the measured transducer parameters for the transducer monitoring a second target object material into a calibration parameter 56 for use in transforming the output of the transducer and thus, the use of the transducer, from the first target object material to the second target object material by linearizing the output of the transducer into gap values as a function of the calibration parameter, the gap values being correlative to a distance between the transducer and the second target object material being monitored.

The processing means 50 is, in turn, connected to a digital to analog converter 60 via connection 52 and the digital to analog converter 60 is operatively coupled to, via connection 62, a physical output device(s) 70 such as relay outputs, current output such as 4–20 mA current outputs, and communication links between processing means 50 and other external platforms for, inter alia, generating alarms based on the processing means 50 determining that the linearized output of the transducer 20 exceeded established limits (for example, user-established limits) and, turning on alarms via the digital to analog converter 60 for automatically shutting down the machine being monitored by the transducer and/or automatically annunciating machinery problems to operators and other plant personnel.

More particularly, and referring to FIGS. 1 and 2, the transducer calibration system 10 is comprised of at least one sensor or transducer 20 coupled to the signal conditioning circuit 30 via connection 22 for providing an electrical signal output correlative to movement or position of a target T, such as a piston rod or a rotating shaft of a machine, relative to the transducer 20. Examples of systems comprised of the sensor or transducer 20, connector 22 and signal conditioning circuit 30 are sold by the assignee of the present patent application, Bently Nevada, LLC of Minden, Nev., USA, some of which are sold under the names 7200 and 3300 Proximity Transducer Systems.

The signal conditioning circuit 30 is operatively coupled to, via connection 32, the sampling and digitizing means 40 such as an analog to digital converter which, in turn, is connected, via connection 42, to the digital processing means 50 and associated memory 54.

In one preferred form, the digital processing means 50 can be comprised of one or more processors each having an associated memory such as a monitor 80 including memory 100 and a computer 120 including memory 127.

The monitor 80 can also include sampling and digitizing means 40 and can be further comprised of a digital signal processor (DSP) 90 and a controller or microcontroller 110. As shown in FIG. 1, the sampling and digitizing means 40 is operatively coupled to, via connection 92, the digital signal processor (DSP) 90. The digital signal processor (DSP) 90 and an associated memory 100 are connected, via connections 112 (data bus), 114 (address bus), and 116 (control lines), to each other and to the controller 110. The monitoring system 80 and thus, the digital signal processor 90, can be programmed via the microcontroller 110 and in accordance with the present invention for linearizing the output of the transducer into gap values as a function of the calibration parameter, the gap values being correlative to a distance between the transducer and the second target object material being monitored. The computer can be programmed and the monitor can be programmed, via the microcontroller 110, to provide, via a communication connection 122, bi-directional communication and thus, provide the means for communicating, inter alia, the digitized electrical signals engendered from the transducer 20 from the monitor 80 to the computer 120 and the calibration parameter from the computer 120 to the monitor 80. Thus, the monitor 80, in combination with the computer 120, provide the means, in accordance with the present invention, for transforming both previously established transducer parameters for a transducer monitoring a first target object material and measured transducer parameters for the transducer monitoring a second target object material into a calibration parameter, and then transforming the output of the transducer and thus, the use of the transducer, from the first target object to the second target object by linearizing the output of the transducer into gap values as a function of the calculated calibration parameter, the gap values being correlative to the distance between the transducer and the second target object material being monitored.

The digital signal processor (DSP) 90, associated memory 100, and microcontroller 110 can be operatively coupled to the digital to analog converter 60 for providing the means for receiving and conveying information to physical output devices 70 such as relay outputs, current output such as 4–20 mA outputs, and communication links between processors or monitors and other external platforms for, inter alia, generating alarms based on the linearized output of the transducer exceeding established limits (for example, user-established limits) and using the alarms to automatically shut down the machine being monitored by the transducer and/or automatically annunciate machinery problems to operators and other plant personnel.

The analog to digital converter 40, the digital signal processor (DSP) 90, associated memory 100, and controller or microcontroller 80 can be implemented with a monitoring system such as, for example, a 3300 or 3500 Monitoring System sold by the assignee of the present patent application, Bently Nevada, LLC of Minden, Nev., US. The 3500 Monitoring System includes power supplies, monitors, transducer inputs to the monitors, relay outputs, 4–20 mA outputs and communications between monitors and other external platforms.

Computer 120 can be a laptop computer, a desktop computer, a networked, or distributed computer. Computer 120 is comprised of a processing and storage means 124 including a processor 123, memory 127, a storage medium 125, a graphical user interface 126 including a display 128, at least one entry device such as a selection or mouse device 130, and/or a keyboard 132 as are all well known to those having ordinary skill in the art, and informed by the present disclosure. Communication between the user, the computer and the monitor is done through the graphical user interface 126.

A power supply 130 is connected to and provides power, as required, for the transducer 20, the conditioning circuit 30, and the monitor 80. The power supply 130 could also provide power, as required, to the computer 120.

Figure 3:
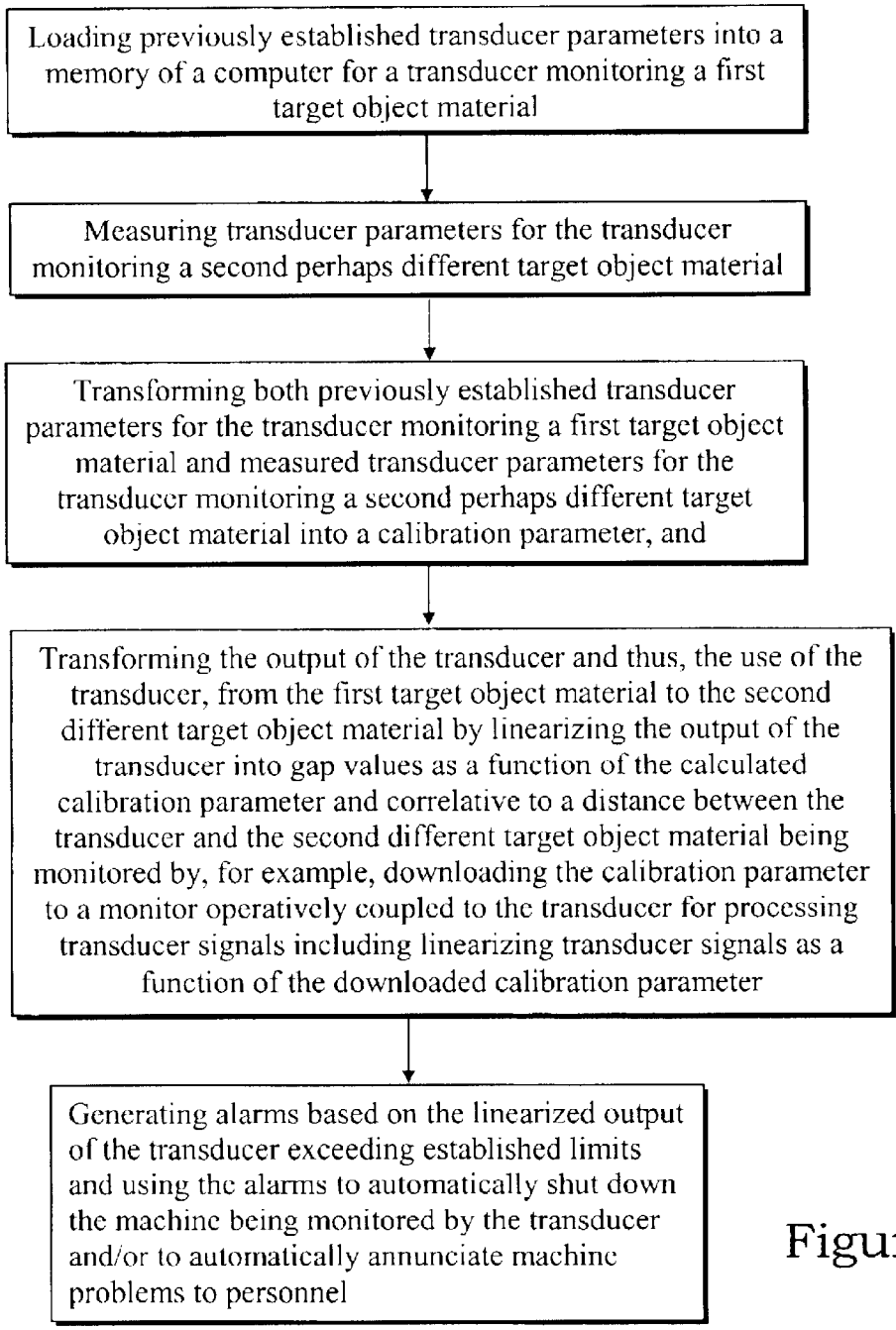
FIG. 3 is a general flowchart view of a transducer calibration method of the transducer calibration system pursuant to the present invention.

FIG. 3 shows a flowchart view of a transducer calibration method in accordance with the present invention and which can be used to program processing means 50 for carrying out the present invention in combination with monitor 80, signal conditioning circuit 30, and transducer 20. Referring to FIGS. 1 through 3, the transducer calibration method of the present invention includes the steps of: 1) transforming, with the computer 120, both stored previously established transducer parameters for the transducer 20 monitoring a first target object material and measured transducer parameters for the transducer 20 monitoring a second different target object material T into a calibration parameter 56 (FIG. 2), and 2) downloading the calibration parameter 56 from the computer 120 to the monitor 80 where it can be stored in memory 100 and employed by the digital signal processor (DSP) 90 for transforming the output of the transducer and thus, the use of the transducer, from the first target object material to the second target object material by linearizing the output of the transducer into gap values as a function of the calculated calibration parameter and correlative to a distance between the transducer and the second different target object material being monitored. The above delineated method also can be employed when the first and the second target objects are formed from the same material.

The transducer calibration method, in accordance with the present invention further includes the steps of generating alarms based on the linearized output of the transducer exceeding established limits and using the alarms to automatically shut down the machine being monitored by the transducer and/or to automatically annunciate machine problems to personnel. In one embodiment, the monitor 80 can be operatively coupled to the digital to analog converter 60 for providing the means for receiving and conveying information to physical output devices 70 such as relay outputs, current output such as 4–20 mA outputs, and communication links between processors or monitors and other external platforms for, inter alia, generating alarms based on the linearized output of the transducer exceeding established limits (for example, user-established limits) and using the alarms to automatically shut down the machine being monitored by the transducer and/or automatically annunciate machinery problems to operators and other plant personnel.

In accordance with the present invention, the transforming step of the above transducer calibration method can further include the steps of: 1) retrieving previously recorded transducer calibration parameters from the storage medium 125 and loading the transducer calibration parameters into memory 127 wherein the transducer calibration parameters are comprised of signal values correlative to an output of the transducer monitoring the first target object material; 2) using the graphical user interface, the selection or mouse device 130 and/or keyboard 132 for replacing the signal values with received signal values, the received signal values being correlative to an output of the transducer monitoring the second different target object material, and 3) calculating, with the computer 120, the calibration parameter as a function of both the signal values correlative to the output of the transducer monitoring the first target object material and the replaced signal values correlative to the output of the transducer monitoring the second different target object material.

Alternatively, and also in accordance with the present invention, the transforming step of the transducer calibration method can further include the steps of: 1) retrieving boundary parameters, correlative to transducer operation, from the storage medium 125; 2) using the graphical user interface, the selection or mouse device 130 and/or keyboard 132 for replacing the signal values with received signal values, the received signal values being correlative to an output of the transducer monitoring the second different target object material, and 3) calculating, with the computer 120, the calibration parameter of the transducer as a function of both the boundary parameters and the received signals.

Figure 4:
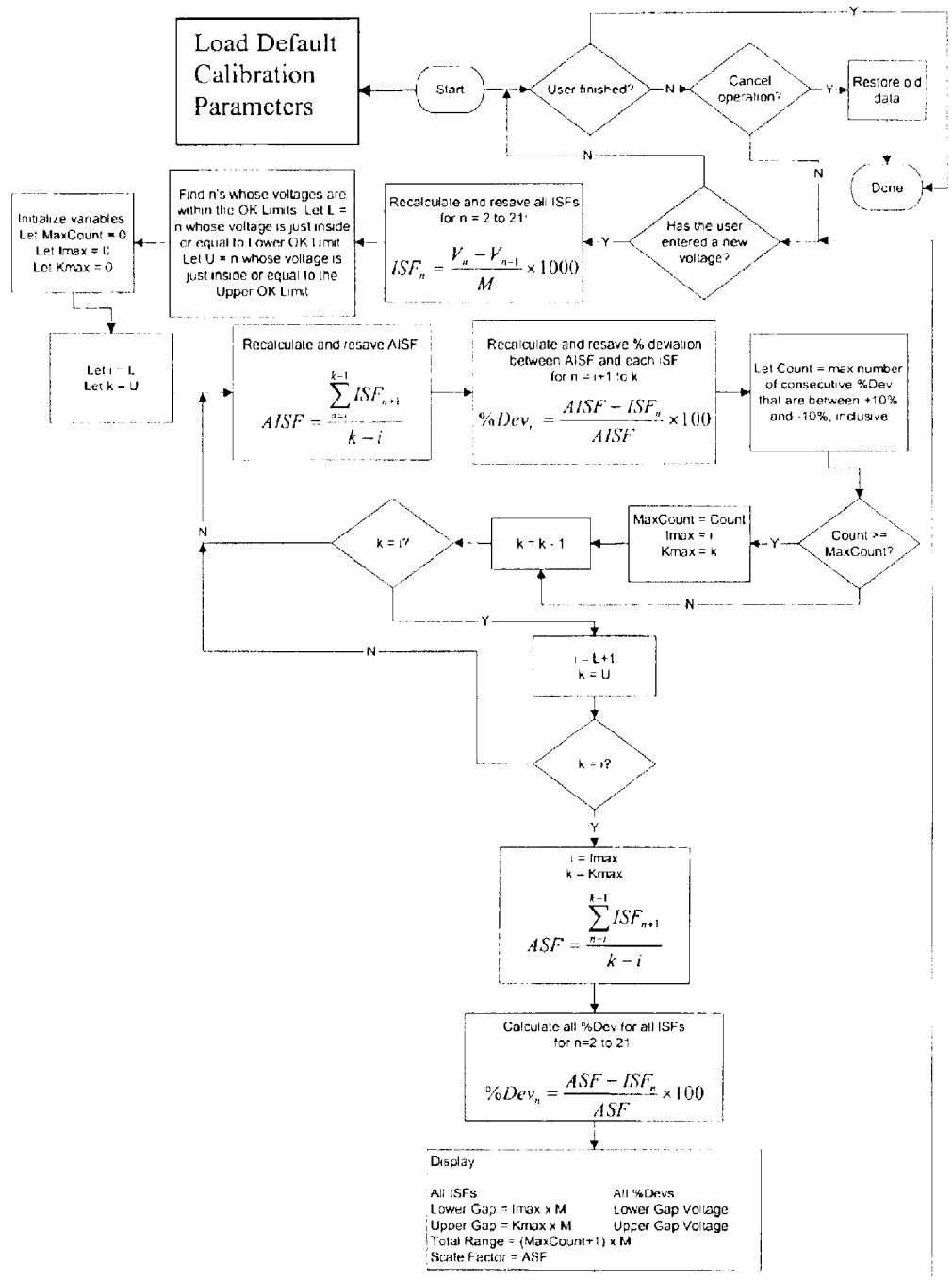
FIG. 4 is a detailed flowchart view of a transducer calibration method of the transducer calibration system pursuant to the present invention.

FIG. 4 shows a more specific flowchart view of the transducer calibration method in accordance with the present invention and which can be used to program processing means 50 (e.g., computer 120 and monitor 80) for carrying out the present invention in combination with signal conditioning circuit 30 and transducer 20. Referring to FIGS. 1 through 4, the transducer calibration method of the present invention includes the steps of: 1) loading a default configuration of a transducer into memory 127 of the computer 120, the default configuration comprised of N voltage values correlative to a N distances between the transducer and a first target object, where N is an integer, and N−1 incremental scale factor values correlative to the N voltage values starting with N equal to 2; 2) using the graphical user interface, the selection or mouse device 130 and/or keyboard 132 for iteratively replacing at least one of the N voltage values with a measured voltage value correlative to a distance between the transducer and a second target object and recalculating, with the computer, the N−1 incremental scale factor values during each iteration wherein a final iteration defines N−1 final incremental scale factor values; 3) identifying, with the computer 120, a series of adjacent incremental scale factor values from the N−1 final ISF values that meet a predefined criteria (e.g., a series of adjacent incremental scale factor values having a largest grouping of consecutively adjacent scale factor values having a predefined deviation); 4) calculating, with the computer 120, a transducer calibration parameter as a function of the identified series of adjacent incremental scale factor values; 5) transforming the output of the transducer and thus, the use of the transducer, from the first target object material to the second different target object material by linearizing the output of the transducer into gap values as a function of the calculated calibration parameter and correlative to a distance between the transducer and the second different target object material being monitored by, for example, downloading the calibration parameter 56 from the computer 120 to the monitor 80, operatively coupled to the transducer 20, where it can be stored in memory 100 and employed by the digital signal processor (DSP) 90 for transforming the output of the transducer and thus, the use of the transducer, from the first target object material to the second target object material by linearizing the output of the transducer into gap values as a function of the calculated calibration parameter and correlative to a distance between the transducer and the second different target object material being monitored.

As discussed above, the transducer calibration method, in accordance with the present invention further includes the step of generating alarms based on the linearized output of the transducer and in one embodiment, the monitor 80 can be operatively coupled to the digital to analog converter 60 for providing the means for receiving and conveying information to physical output devices 70 for, inter alia, generating alarms based on the linearized output of the transducer exceeding established limits (for example, user-established limits) and using the alarms to automatically shut down the machine being monitored by the transducer and/or automatically annunciate machinery problems to operators and other plant personnel.

Additionally, and in accordance with the present invention, the step of identifying, with the computer 120, the series of adjacent incremental scale factor values from the N−1 final incremental scale factor values that meet a predefined criteria in the above transducer calibration method can further include the steps of: 1) defining a range of voltage values; 2) calculating an average of the N−1 final incremental scale factor values which fall within the range of voltage values; 3) calculating a percent deviation between the average and each one of the N−1 final incremental scale factor values which fall within the range of voltage values for defining percent deviation values; 4) determining each percent deviation value which falls within a predefined percent deviation value (e.g., 10%) and which is adjacent another percent deviation value which also falls within the predefined percent deviation value; 5) identifying the series of adjacent incremental scale factor values from the N−1 final incremental scale factor values by identifying at least one series of consecutively adjacent final incremental scale factor values that has a largest grouping of adjacent percent deviations which fall within the predefined percent deviation value.

For example, if the N−1 final incremental scale factor values are comprised of one series of consecutively adjacent final incremental scale factor values that has a grouping of two consecutively adjacent percent deviations which fall within the predefined percent deviation value, another series of consecutively adjacent final incremental scale factor values that has a grouping of three consecutively adjacent percent deviations which fall within the predefined percent deviation value, and a further series of consecutively adjacent final incremental scale factor values that has a grouping of four consecutively adjacent percent deviations which fall within the predefined percent deviation value the computer sequences through the N−1 final incremental scale factor values, identifies each grouping and then determines the series with the largest grouping of consecutively adjacent final incremental scale factor values which fall within the predefined percent deviation value wherein the calibration or scaling factor is determined as a function of the determined series with the largest grouping.

Figure 5:
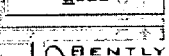
FIG. 5 is a screenshot view of a first calibration view pursuant to the present invention and of one default transducer calibration form in a computer displaying a standard ideal curve as if the transducer were viewing 4140 steel.

In use and operation, and referring to the drawings and in particular to FIG. 1, the present invention provides a transducer calibration system 10 which can be embodied in a machinery protection system monitoring rotating and/or reciprocating machines or mechanical systems. In this embodiment, the system 10 is comprised of the computer 120 comprised of the processor and memory means 124 operatively coupled to the monitor 80 via connection 122. The computer further includes the graphical user interface 126 including the display 128, and at least one entry device such as the selection device 130 (e.g., a mouse device) and/or the keyboard 132. The computer includes a calibration form and a default configuration or calibration (including a default curve such as the one shown in Table 1 below and as illustrated in FIG. 5) of the transducer 20 monitoring a first target object stored in storage medium 125 such as a hard drive. The computer 120 including the graphical user interface 126, provide the means for loading the calibration form and the default configuration into memory means 127 and for displaying the calibration form on the display 128 along with displaying default configuration values within the calibration form in accordance with the methods of the present invention. The default configuration is comprised of N voltage values, where N is an integer, N−1 gap increments, N−1 calculated ISF values, N−1 calculated percent deviation values, a maximum usable linear range, a lower gap distance and correlative voltage, an upper gap distance and correlative voltage, a calibration factor or Scale Factor, and a lower and upper OK limit. Please see Table 1 below and FIG. 5.

TABLE 1

| n | Gap Increment nM* | Voltage Reading V (dc) $V_n$ | Incremental Scale Factor $ISF_n$ |
|---|---|---|---|
| 1 | 5 | −0.55 | N/A |
| 2 | 10 | −1.00 | −90 |
| 3 | 15 | −2.00 | −200 |
| 4 | 20 | −3.00 | −200 |
| 5 | 25 | −4.00 | −200 |
| 6 | 30 | −5.00 | −200 |
| 7 | 35 | −6.00 | −200 |
| 8 | 40 | −7.00 | −200 |
| 9 | 45 | −8.00 | −200 |
| 10 | 50 | −9.00 | −200 |
| 11 | 55 | −10.00 | −200 |
| 12 | 60 | −11.00 | −200 |
| 13 | 65 | −12.00 | −200 |
| 14 | 70 | −13.00 | −200 |
| 15 | 75 | −14.00 | −200 |
| 16 | 80 | −15.00 | −200 |
| 17 | 85 | −16.00 | −200 |
| 18 | 90 | −17.00 | −200 |
| 19 | 95 | −18.00 | −200 |
| 20 | 100 | −19.00 | −200 |
| 21 | 105 | −19.80 | −160 |

In table 1 above, M is a unit of measure such as 5 mils, 10 mils, 125 micrometers, or 250 micrometers depending on the transducer type and the units configured.

In this particular embodiment, the transducer calibration system 10 further includes a mounting device 150 comprised of a strap 152, a pair of eyebolts 154, a mounting base 156, and a probe mounting adaptor or collets 158 for providing the means for locating the transducer adjacent a target object T (the second target object) for monitoring the target object material and providing an electrical signal output, to the signal conditioning circuit 30 via connection 22, the electrical signal output of the transducer being correlative to a position of the target object T relative to the transducer or the gap or distance between the transducer and the target object. The strap attaches to the mounting base via one of the eyebolts located on one side of the mounting base and is wrapped around the target and coupled to another eyebolt located on another side of the mounting base to hold the mounting base firmly in position. A spindle micrometer 160 provides the means for changing and measuring a gap or distance between the transducer and the target object and thus, as the user moves the micrometer the transducer 20 moves toward or away from the target. Specific examples of the above locating means (mounting device 150) and the changing and measuring means (spindle micrometer 160) are sold at the present time by the assignee of this application, Bently Nevada, LLC of Minden, Nev. under the name 3300 XL Precision Micrometer and under the name 3300 XL Shaft Micrometer.

The signal conditioning circuitry 30 receives the electrical signal output of the transducer 20 and provides a conditioned signal to the monitor 80 which provides the means for transforming the conditioned electrical signal output of the transducer for X increments of change in the distance between the transducer and the target object material into X number of digital voltage outputs, where X is an integer. In one preferred form, X is equal to N.

The controller 110, the computer 120 and the communications link 122 between the monitor 80 and the computer 120 provide the means for transferring the X number of digital voltage outputs from the controller 110 to the computer 120.

Figure 6:
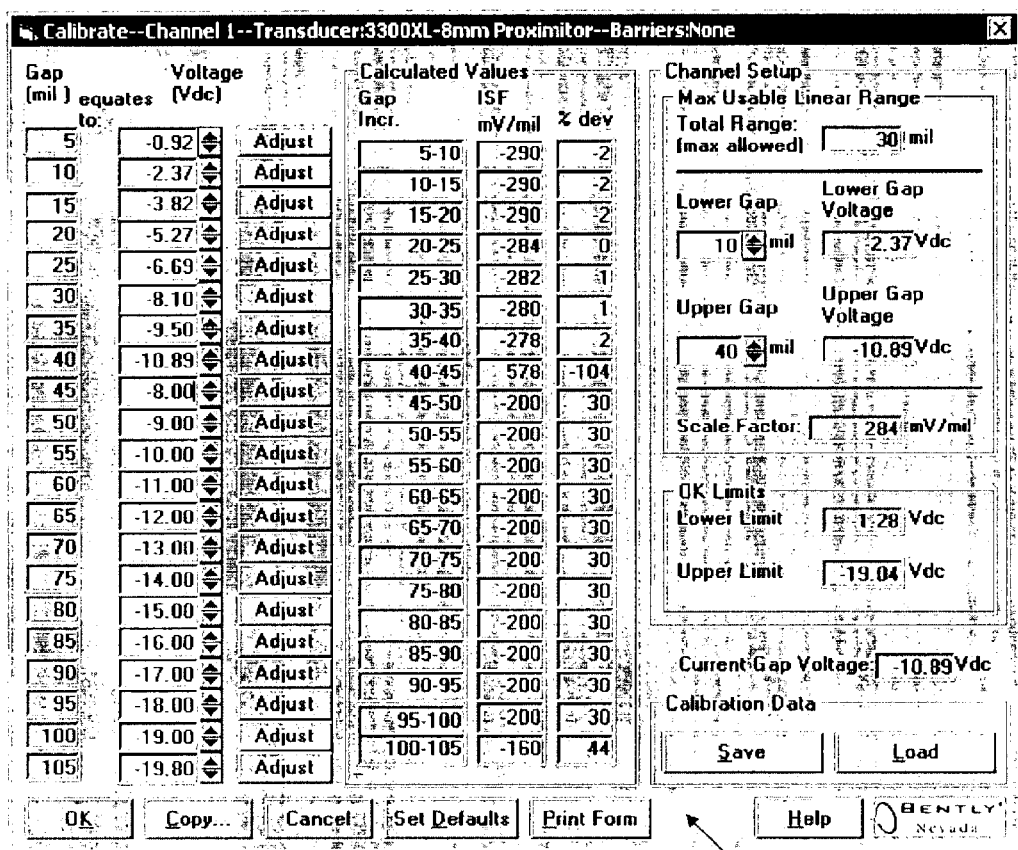
FIG. 6 is a screenshot view of a second calibration view pursuant to the present invention and of a beginning of a calibration of a transducer (new voltages have been entered up to 40 mils) to a piston rod made of tungsten carbide.
Figure 7:
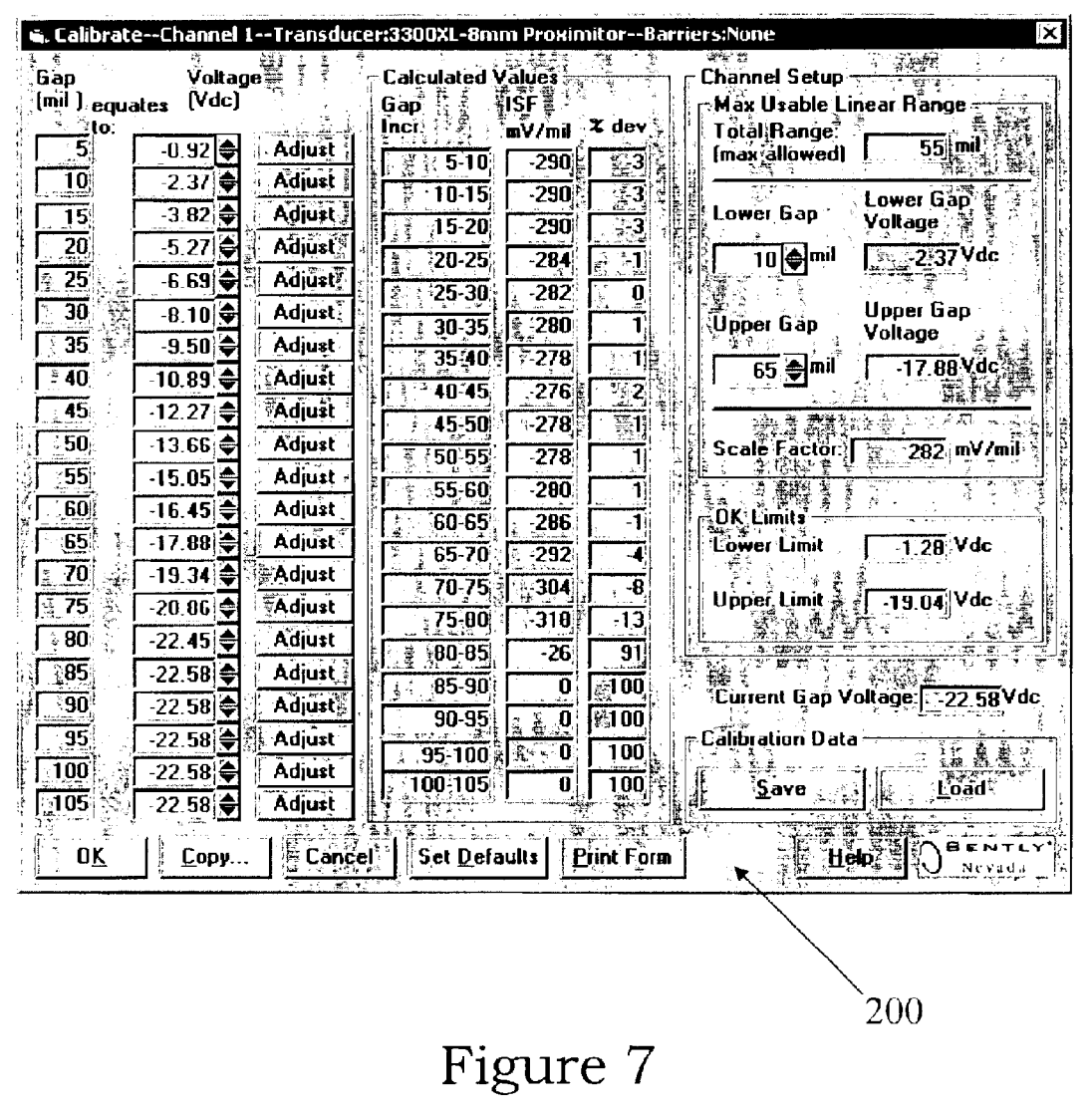

The computer 120 process the digital voltage outputs and preferable displays numerical values of the digital voltage outputs on the display 128 via the graphical user interface 126 (please see FIGS. 5 through 7). For example, the computer 120 can display, via the graphical user interface, a numerical current gap voltage for each of the X increments of change in the distance between the transducer and the target object material. In one preferred form, X is equal to N.

The graphical user interface also provides the means for the computer to receive at least one of the voltage outputs for replacing at least one of the N default voltage values.

Particularly, the present provides a method employing computer 120 having the graphical 126 user interface including the display 128, and at least one entry device such as the selection device 130 and/or the keyboard 132, for providing a calibration form on the display 128 of the computer 120 and entering into the calibration form on the display 128, the method of the present invention comprising: 1) retrieving from the storage medium 125 and displaying on the display 128 a calibration form 200 (FIGS. 5 through 7); 2) retrieving from the storage medium 125 and displaying on the display 128, and within the calibration form 200, default calibration values of the transducer monitoring the first target object material, the displayed default calibration values being comprised of N voltage values, wherein N is an integer; 3) receiving, by using at least one entry device such as the selection device 130 (e.g., a mouse device) and/or the keyboard 132, at least one voltage entry replacing at least one of the N voltage values displayed in the calibration form, the at least one voltage entry being correlative to an output of the transducer monitoring the target object T (the second target object); and, in response to the at least one voltage entry, determining a calibration parameter as a function of the N voltage values including the at least one voltage entry replacement for use with the transducer monitoring the target object T (the second target object). In one preferred form, the N values entered are each equal to one the X increments of change in the distance between the transducer and the target object material and thus, the N values entered are equal to the X number of digital voltage outputs.

The computer 120 provides the means for determining or calculating, in response to the receipt of at least one of the voltage outputs, a calibration parameter for the transducer monitoring the target object in accordance to the methods of the present invention.

The computer further provides the means for iteratively receiving and iteratively replacing each one of the N voltage values and calculating N−1 incremental scale factor values during each iteration wherein a final iteration defines N−1 final incremental scale factor values. The computer further provides the means for identifying a largest grouping of adjacent ISF values from the N−1 final ISF values that meet a predefined criteria and means for employing the largest grouping of adjacent ISF values for determining, defining or calculating the calibration parameter.

The computer can then download the calibration parameter to the monitor 80 operatively coupled to the transducer 20 for calibrating the transducer from the first target object to the second target object. The monitor 80 linearizes the output of the transducer into gap values as a function of the calibration parameter, the gap values being correlative to a distance between the transducer and the target object material being monitored.

The first target object and the second target object can be formed from the same or different materials.

In one particular use and operation application, the present invention provides a transducer calibration system 10 which can be embodied in a machinery protection system monitoring a piston rod of a reciprocating machine (rod drop monitoring). The transducer calibration system 10 uniquely automates the ISF, ASF and % deviation calculations for the user, uniquely identifies the largest linear range available for the given system which can be employed with the monitor, and uniquely determines a calibration factor from the uniquely identified largest linear range and restricts the use of the transducer to the linear portion of the curve. The user does not have to write down any numbers by hand, nor does the user have to manipulate data or do any calculations. The system 10 is set up as delineated above and as shown in FIG. 1 using either the standard micrometer or the shaft micrometer.

FIG. 5 is a screenshot view of a first calibration view of one default transducer calibration form in the computer displaying a standard ideal curve as if the transducer were viewing 4140 steel. The left side of the form shows the gap increments. The gap increments are determined from the transducer type and will be displayed in software in S.I. units or in English units depending on how the initial download was set up. Additionally, associated with each gap increment is an ideal voltage reading for that gap. A usable linear range is preferably shown in black font voltage readings in the curve data. Preferably, a blue font is used to show voltages that are outside the usable range limits. A maximum usable linear range is also identified in the upper right hand corner as Total Range. Additionally, the limits of any allowable total range are defined by the Lower Gap and its voltage and by the Upper Gap and its voltage as shown in the form just below the Total Range. The calibration parameter or ASF is displayed as Scale Factor. The OK Limits for the configured transducer are shown for informational purposes. (OK Limits define a predetermined voltage level that will be exceeded if the transducer opens or shorts). The Calibration Data Save Button and Load Button allow the user to save and reload the calibration data after a new curve has been generated.

Once the default configuration has been downloaded, instead of reading the voltage from a multimeter or from the front panel of the monitor the user can "see" the voltage the monitor is reading from the transducer in the lower right hand corner of this configuration form as delineated hereinabove. It is shown in the box labeled Current Gap Voltage (shown now at a negative 2.99 Vdc). As the user adjusts the micrometer 160 the voltage in the box will change accordingly. The Current Gap Voltage reading can be entered into the transducer curve in the form by clicking an Adjust Button next to the appropriate gap increment that corresponds to the existing physical position of the probe face with respect to the rod. (Or, the user may just type in the voltage value without using the Adjust Button.) The user then moves the micrometer at the piston rod to the next gap position, waits for the Current Gap Voltage reading to stabilize or settle out, and clicks the next Adjust button that is associated with the probe gap increment. The process is continued until the complete curve is populated with voltage readings for each gap increment.

As voltages are entered into the list the computer will automatically calculate and update the ISF's, % deviation from ASF, Total Range, Lower and Upper Gap and the Scale Factor.

FIG. 6 shows a screenshot view of a second calibration view pursuant to the present invention and showing new voltages being entered up to 40 mils for calibrating a transducer to a piston rod made of tungsten carbide.

When the complete list has been filled in, the resultant maximum usable range will be identified. The usable linear range is defined by the following: The usable linear range lies between the Upper Gap and the Lower Gap. The Upper Gap Voltage and Lower Gap Voltage must be equal to or within the predetermined OK Limits for the transducer and barrier options configured. The ISF values must be within 10% of the ASF.

FIG. 7 shows a screenshot view of a third calibration view pursuant to the present invention and showing an example of the completed curve and updated parameters. Thus, FIG. 7 shows the completion of voltage entries in the calibration form shown in FIG. 6.

The user can then download the new transducer curve information to the monitor by entering a load selection such as by selecting or by clicking a Load Button. In this example the monitor will then use 282 mV/mil as the Scale Factor in its calculations of Piston Rod movement. The usable linear range for this rod material and transducer is 55 mils (from 10 to 65 mils) and alarms (relay trips) can only be set within this range. This system will be able to monitor rod movement from 10 to 55 mils accurately.

In light of the above and referring again to FIG. 4, a defined given when viewing this flow chart is that the user has a default curve loaded such as the one shown in FIG. 5 and the computer is communicating with the monitor. OK Limits for the transducer and the units configured are known and Default Total Range, Upper Gap, Lower Gap, Upper Gap Voltage, Lower Gap Voltage, and Scale Factor are shown in the form.

In this particular use and operation application, the present invention provides a transducer method which is best shown in FIG. 4. First, the method includes the step of a loading a default curve such as the one shown in FIG. 5 into the computer. OK Limits for the transducer and the units configured are known and Default Total Range, Upper Gap, Lower Gap, Upper Gap Voltage, Lower Gap Voltage, and Scale Factor are shown in the form. Next, as each voltage is entered the computer the computer calculates the ISF values for the complete list of voltages entered, identifies Allowable OK area by letting the lower limit equal the nth gap reading whose voltage is just inside or equal to the Lower OK Limit and letting the upper limit equal the nth gap reading whose voltage is inside or equal to the Upper OK Limit. Then, for each combination of adjacent ISF values (two being the minimum) that lie between and inclusive of L and U: calculate the average incremental scale factor (AISF, i.e., the ASF over the given range of values chosen for each iteration.), calculate the % Deviation between the AISF and the ISF, count the number of adjacent % Deviations that are less than or equal to 10% and greater than or equal to −10%, Select the combination of adjacent ISF values that resulted in the most number of adjacent % Deviations between its AISF and ISF, and then let the Scale Factor equal that combination's AISF.

Next, calculate and display all the % Deviations using that AISF, Display Total Range {(U−L)×M], Display Lower Gap (L×M) and its voltage, Display Upper Gap (U×M) and its voltage, Display Scale Factor (the combination's AISF), and calculate and display all the % Deviations using that AISF, determine which portion is the usable range and If more than one combination resulted in the same number of most adjacent % Deviations between its AISF and ISF use the last one encountered and If more than one section of the same combination resulted in the same number of most adjacent % Deviations use the last one encountered.

Moreover, having thus described the invention, it should be apparent that numerous modifications and adaptations may be resorted to without departing from the scope and fair meaning of the present invention as set forth hereinabove and as described hereinbelow by the claims.

We claim:

1. A computerized method for calibrating a transducer:
    loading a default configuration of a transducer into a memory of a computer, said default configuration comprised of N voltage values and N−1 incremental scale factor values correlative to said N voltage values starting with N equal to 2, wherein N is an integer;
    iteratively replacing at least one of said N voltage values and recalculating said N−1 incremental scale factor values during each iteration wherein a final iteration defines N−1 final incremental scale factor values;
    identifying a series of adjacent incremental scale factor values from said N−1 final ISF values that meet a predefined criteria;
    calculating a transducer calibration parameter as a function of said identified series of adjacent incremental scale factor values that meet the predefined criteria;
    transforming the output of the transducer and thus, the use of the transducer, from the first target object material to the second different target object material by linearizing the output of the transducer into gap values as a function of the calculated calibration parameter and correlative to a distance between the transducer and the second different target object material being monitored.

2. The method of claim 1 further including the step of downloading the calibration parameter to a monitor operatively coupled to the transducer for performing the step of transforming the output of the transducer and thus, the use of the transducer, from the first target object material to the second different target object material by linearizing the output of the transducer as a function of the calculated calibration parameter such that the output of the transducer monitoring the second different target object material is transformed into gap values correlative to a distance between the transducer and the second different target object material being monitored for providing machine protection.

3. The method of claim 1 wherein the step of identifying the series of adjacent incremental scale factor values from said N−1 final incremental scale factor values that meet a predefined criteria includes the steps of:
    defining a range of voltage values;
    calculating an average of said N−1 final incremental scale factor values which fall within said range of voltage values;
    calculating a percent deviation between said average and each one of said N−1 final incremental scale factor values which fall within said range of voltage values for defining percent deviation values;
    determining each percent deviation value which falls within a predefined percent deviation value and which is adjacent another percent deviation value which also falls within the predefined percent deviation value;
    identifying the series of adjacent incremental scale factor values from said N−1 final incremental scale factor values by identifying at least one series of adjacent final incremental scale factor values that has a largest grouping of adjacent percent deviations which fall within the predefined percent deviation value.

4. In a computer system having a graphical user interface including a display, and at least one entry device such as a selection device and/or keyboard, a method of providing and entering into a calibration form on the display, the method comprising:
    retrieving and displaying a calibration form;
    retrieving and displaying within the calibration form;
        default calibration values of a first transducer monitoring a first target object material, the displayed default calibration values being comprised of N voltage values, wherein N is an integer;

receiving at least one voltage entry replacing at least one of the N voltage values displayed in the calibration form, the at least one voltage entry being correlative to an output of a second transducer monitoring a second different target object material;

and, in response to the at least one voltage entry determining a calibration parameter as a function of the N voltage values including the at least one voltage entry replacement for use with the transducer monitoring the second different target object material.

5. The method of claim 4 further including the steps of:

receiving at least one entry within the calibration form for downloading the calibration parameter to a monitor operatively coupled to the transducer for transforming the output of the transducer, and using the monitor for linearizing the output of the transducer as a function of the calculated calibration parameter such that the output of the transducer monitoring the second different target object material is transformed into gap values correlative to a distance between the transducer and the second different target object material being monitored.

6. The method of claim 4 further including the steps of:

iteratively receiving N new voltage entries replacing the N voltage values displayed in the calibration form, the N new voltage entries each being correlative to an output of a second transducer monitoring a second different target object material at N different distances;

and, in response to the N new voltage entries calculating N−1 incremental scale factor values during each iteration wherein a final iteration defines N−1 final incremental scale factor values;

identifying a series of adjacent incremental scale factor values from said N−1 final ISF values that meet a predefined criteria, and determining and displaying the transducer calibration parameter as a function of said identified series of adjacent incremental scale factor values that meet the predefined criteria.

7. The method of claim 6 further including the step of receiving at least one entry for downloading the calibration parameter to a monitor operatively coupled to the transducer for transforming the output of the transducer and thus, the use of the transducer, from the first target object material to the second different target object material, and using the monitor for transforming the output of the transducer and thus, the use of the transducer, from the first target object material to the second different target object material by linearizing the output of the transducer as a function of the calculated calibration parameter such that the output of the transducer monitoring the second different target object material is transformed into gap values correlative to a distance between the transducer and the second different target object material being monitored for providing machine protection.

8. A transducer calibration system, comprising in combination:

a computer;

means for loading a default configuration of a transducer monitoring a first target object into a memory of said computer, said default configuration comprised of N voltage values, where N is an integer;

means for locating the transducer adjacent a second target object for monitoring the target object material and providing an electrical signal output correlative to a position of the target object material relative to the transducer;

means for changing the distance between said transducer and the target object material;

means for transforming the electrical signal output of said transducer for X increments of change in the distance between said transducer and the target object material into voltage outputs, where X is an integer;

means for receiving into said computer at least one of said voltage outputs for replacing at least one of said N voltage values;

means for determining, in response to the receipt of at least one of said voltage outputs, a calibration parameter for the transducer monitoring the target object material, and means for linearizing said output of said transducer into gap values as a function of said calibration parameter, the gap values being correlative to a distance between said transducer and the target object material being monitored.

9. The transducer calibration system of claim 8 further including means for generating alarms based on the linearized output of the transducer exceeding established limits for providing machine protection.

10. The method of claim 9 further including means for using the alarms to automatically shut down the machine being monitored by the transducer for providing machine protection.

11. The method of claim 10 further including means for using the alarms to automatically annunciate machine problems to personnel.

12. The transducer calibration system of claim 8 further including means for downloading said calibration parameter to a monitor operatively coupled to said transducer for calibrating said transducer from the first target object to the second target object, said monitor including means for linearizing said output of said transducer into gap values as a function of said calibration parameter.

13. The transducer calibration system of claim 8 wherein said receiving means further includes means for iteratively receiving and iteratively replacing each one of said N voltage values and calculating N−1 incremental scale factor values during each iteration wherein a final iteration defines N−1 final incremental scale factor values.

14. The transducer calibration system of claim 13 wherein said determining means further includes means for identifying a largest grouping of adjacent ISF values from said N−1 final ISF values that meet a predefined criteria and means for employing said largest grouping of adjacent ISF values for determining said calibration parameter.

* * * * *